(12) United States Patent  (10) Patent No.: US 8,788,994 B2
Hu et al.  (45) Date of Patent: Jul. 22, 2014

(54) ROUTING OF LOCAL CLOCK INTERCONNECTS

(75) Inventors: Haitian Hu, White Plains, NY (US); Chin Ngai Sze, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 13/538,593

(22) Filed: Jun. 29, 2012

(65) Prior Publication Data

US 2014/0007034 A1  Jan. 2, 2014

(51) Int. Cl.
*G06F 17/50*  (2006.01)

(52) U.S. Cl.
USPC .......................................... 716/113

(58) Field of Classification Search
CPC .... G06F 1/10; G06F 17/5031; G06F 17/5077
USPC ...................................... 716/113
See application file for complete search history.

(56) References Cited

U.S. PATENT DOCUMENTS

| | | |
|---|---|---|
| 6,311,313 B1 | 10/2001 | Camporese et al. |
| 6,651,232 B1 | 11/2003 | Pileggi et al. |
| 7,308,669 B2 | 12/2007 | Buehler et al. |
| 7,788,613 B2 | 8/2010 | Walker et al. |
| 8,015,527 B2 | 9/2011 | Buehler et al. |
| 2008/0059933 A1 | 3/2008 | Barke et al. |
| 2010/0100347 A1 | 4/2010 | Buehler et al. |

*Primary Examiner* — Vuthe Siek
*Assistant Examiner* — Aric Lin
(74) *Attorney, Agent, or Firm* — Garg Law Firm, PLLC; Rakesh Garg; John D. Flynn (57) ABSTRACT

In an improved routing of local clock interconnects, an endpoint including a representation of a pin is selected. An original delay is calculated in a route segment that supplies a clock signal to the pin. When the original delay exceeds a delay threshold, a cross-link is added in the route such that the cross-link completes a non-tree sub-network including the segment. The non-tree sub-network is a part of a non-tree network of interconnects carrying the clock signal. A revised delay is calculated in the segment without using delay information corresponding to another non-tree sub-network. The non-tree sub-network is virtually manipulated such that the revised delay can be computed in the manner of computing delay of a tree network. The route is modified using the revised delay in the segment such that a clock skew at the pin is reduced.

20 Claims, 6 Drawing Sheets

ROUTING OF LOCAL CLOCK INTERCONNECTS

BACKGROUND

1. Technical Field

The present invention relates generally to a method, system, and computer program product for designing an integrated circuit (IC). More particularly, the present invention relates to a method, system, and computer program product for improved routing of local clock interconnects to reduce delay in a network structure.

2. Description of the Related Art

Modern day electronics include components that use ICs. ICs are electronic circuits formed using Silicon as a substrate and by adding impurities to form solid-state electronic devices, such as transistors, diodes, and resistors. Commonly known as a "chip," an IC is generally encased in hard plastic. The components in modern day electronics generally appear to be rectangular black plastic pellets with connector pins protruding from the plastic encasement.

Circuit designers use a variety of software tools to design electronic circuits that accomplish an intended task. For example, a digital circuit may be designed to accept digital inputs, perform some computation, and produce a digital output. An analog circuit may be designed to accept analog signals, manipulate the analog signals, such as my amplifying, filtering, or mixing the signals, and produce an analog or digital output. Generally, any type of circuit can be designed as an IC.

Logical synthesis, physical synthesis, and generation of a routed and timing-closed design are some of the functions of an IC design software tool. Logical synthesis is the process of designing the logical operation that is to be achieved by a circuit. Physical synthesis is the mapping, translating, or integration of that logical synthesis to the physical design components, such as logic gate and buffer circuits. Routing and timing-closed design is the design produced by adjusting the wire routings and component placements in a design so that the design meets certain design criteria such as delay of slew of signals, or wirelength restrictions.

The software tools used for designing ICs produce, manipulate, or otherwise work with the circuit layout at very small scales. Some of the components that such a tool may manipulate may only measure tens of nanometer across when formed in Silicon. The designs produced and manipulated using these software tools are complex, often including millions of such components interconnected to form an intended electronic circuitry.

The interconnects between components are called wires. A wire is a connection between parts of electronic components, and is formed using a metallic material that conducts electricity. A net is a collection of interconnections among a group of components. A wire forms a segment of a net, such as a connection between two components, or two connection points called pins.

A wire can be designed to take any one of the several available paths in a design. Placement of a wire on a certain path, or track, is a part of routing. A router is a component of an IC design tool that performs the routing function.

Wires serve many purposes in an IC design. For example, a wire can carry data signals, power, ground current, or one or more clock signals. Many IC designs are synchronized designs, to wit, a clock signal is used to synchronize all or part of the chip.

Clock signals can be delayed depending on the wires that carry the signals (clock wires). Generally, thick wires communicate the clock signals faster than thin wires. Even if the design calls for uniform dimensions for clock wires, manufacturing variations can cause the wires to have different characteristics causing delays in the clock signals.

The difference between the earliest and the latest arrival times of a clock signal using the clock wires in a given design is called "clock skew". Ideally, clock skew should be zero, but practical designs often have some clock skew. Certain low performance designs, such as for circuits used in automobiles or simpler communication devices can tolerate significant clock skews. Certain other designs, such as those of microprocessors, require the clock skew to be within relatively smaller limits and tighter tolerances, such as on the order of less than 10 pico-seconds.

SUMMARY

The illustrative embodiments provide a method, system, and computer program product for improved routing of local clock interconnects in an integrated circuit (IC) design. In one embodiment, a method selects, from a set of endpoints in the IC design, an endpoint, wherein the endpoint is an electronic component represented in the IC design, and includes a representation of a pin at which an electrical connection in the IC design can be configured. The method calculates an original delay in a segment in a route that supplies a clock signal to the pin. The method adds, responsive to the original delay exceeding a delay threshold, a cross-link in the route such that the cross-link completes a non-tree sub-network including the segment, wherein the non-tree sub-network is a part of a non-tree network of interconnects carrying the clock signal in the IC design. The method calculates, using a processor and a memory, a revised delay in the segment without using delay information corresponding to another non-tree sub-network in the non-tree network, wherein the calculating the revised delay includes virtually manipulating the non-tree sub-network such that the revised delay can be computed in the manner of computing delay of a tree network. The method modifies the route using the revised delay in the segment such that a clock skew at the pin is reduced.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

A clock source (source) supplies a clock signal. An IC design can have a set of clock signals originating from a set of clock sources. The illustrative embodiments are described using a single source and a single clock signal for clarity. The illustrative embodiments are similarly applicable to designs that employ more than one clock signals without implying a limitation to a single source design.

A final destination of a clock signal is also called a sink or an endpoint. An intermediate destination of a clock signal may be a clock signal distribution point (distribution point) where the clock signal is received from the source and distributed to several endpoints. An endpoint is usually a component in the design, such as a latch, a flip-flop, or a register. Generally, an endpoint includes an actual point of connection—an actual pin—for receiving the clock signal. An intermediate destination, or distribution point, may act as a virtual pin in the design.

If a clock signal reaches a final destination over a single path the clock signal has a greater chance of being delayed, or skewed, as compared to when the clock signal can reach an endpoint from multiple paths. A tree, network structure is a tree-like path that originates or roots from a source that branches to several endpoints. A sequence of branches forms a single path from the source to a given endpoint.

A non-tree network structure can have any structure to connect a source to an endpoint via one or more paths. A grid is an example of a non-tree network structure. Considering a ten unit by ten unit grid with grid lines forming the wires, and the wires placed every one unit vertically and horizontally. The grid includes a source at intersection (0,0) and an endpoint at intersection (5,4). The endpoint can receive the clock signal from the source via at least two paths (0,0)-(5,0)-(5,4), and (0,0)-(0,4)-(5,4). Many other longer scenic routes can also be traced between the source and the endpoint in such a non-tree network.

Calculating the delay in one segment of a path in a tree network is relatively easy. The delay, called Elmore delay or RC delay, in a segment of a tree is the product of the segment's resistance and the capacitance of the downstream sub-tree from that segment. The downstream sub-tree from a segment is the sub-tree for which an end of the segment serves as root. For calculating Elmore delay of a segment in a tree network, no knowledge of the network that is upstream from the segment to the source is necessary.

However, calculating Elmore delay in a non-tree network is much more difficult because a knowledge of the delays in a segment's upstream network has to be known before the delay in the segment can be computed. Elmore delay calculation in non-tree networks requires solving a system of linear equations.

The illustrative embodiments recognize that presently, a source is connected to a set of distribution points via a tree. The set of distribution points is not necessarily a grid, but when the set does form a grid, the grid intersections act as the distribution points.

An endpoint is then serviced from one of these distribution points. The illustrative embodiments recognize that such an architecture leaves open the possibility that different endpoints may experience different clock skews because of their single path connectivity to distribution point.

The illustrative embodiments further recognize that presently used methods select the distribution point and endpoint pairing by merely estimating the load on a given intermediate destination. For example, for a distribution point S1, presently used methodology determines a number (n) of endpoints (P1-Pn) that S1 is driving. If n approaches or exceeds a predetermined capacity of S1, Pn+1 is connected to another distribution point S2.

A wire connecting an endpoint to a distribution point is called a local clock interconnect. The illustrative embodiments recognize that a single path local clock interconnect causes clock skew issues at the endpoint. The illustrative embodiments further recognize that merely connecting an endpoint via more than one local clock interconnects in a non-tree approach is insufficient for knowing whether the non-tree network has improved the clock signal delay at the endpoint. Thus, a method for routing clock signals to endpoints while reducing delay is desirable.

The illustrative embodiments used to describe the invention generally address and solve the above-described problems and other problems related to providing clock signals to endpoints. The illustrative embodiments provide a method, system, and computer program product for improved routing of local clock interconnects.

Some embodiments are described with respect to certain numbers of endpoints, certain types of non-tree networks, such as a grid, and one clock source, only as examples. An implementation may use an embodiment with any number of endpoints, any combination of tree and non-tree network structures, and any number of clock sources without departing the scope of the invention.

The illustrative embodiments are described with respect to certain ICs or circuits only as examples. Such descriptions are not intended to be limiting on the invention. For example, an illustrative embodiment described with respect to a microprocessor design can be implemented with respect to a design of a memory or another type of circuit without limitation.

The illustrative embodiments are described with respect to certain data, such as IC design layers, only as examples. Such descriptions are not intended to be limiting on the invention. For example, an illustrative embodiment described with respect to a certain layer in an example IC design can be implemented with respect to another layer in another design within the scope of the invention.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention.

The illustrative embodiments are described using specific code, designs, architectures, layouts, schematics, and tools only as examples and are not limiting on the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. An illustrative embodiment may be implemented in hardware, software, or a combination thereof.

The examples in this disclosure are used only for the clarity of the description and are not limiting on the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

Figure 1:
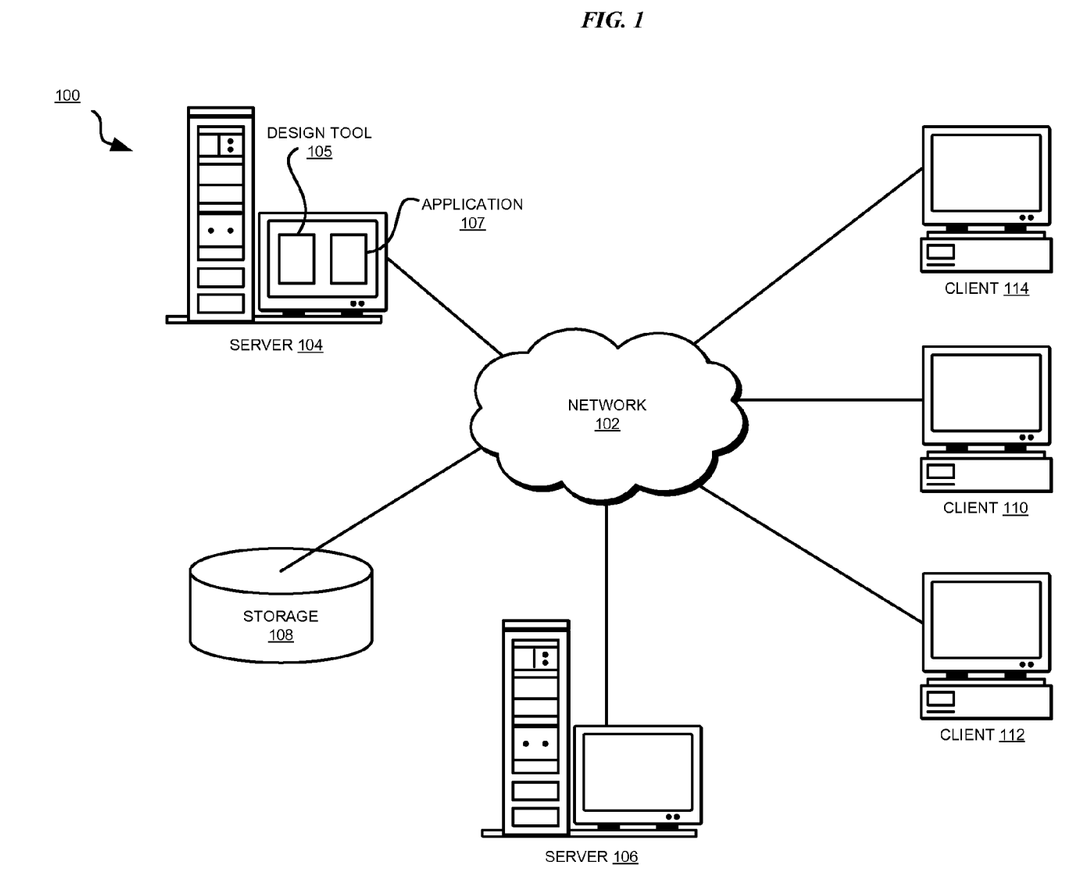
FIG. 1 depicts a pictorial representation of a network of data processing systems in which illustrative embodiments may be implemented.
Figure 2:
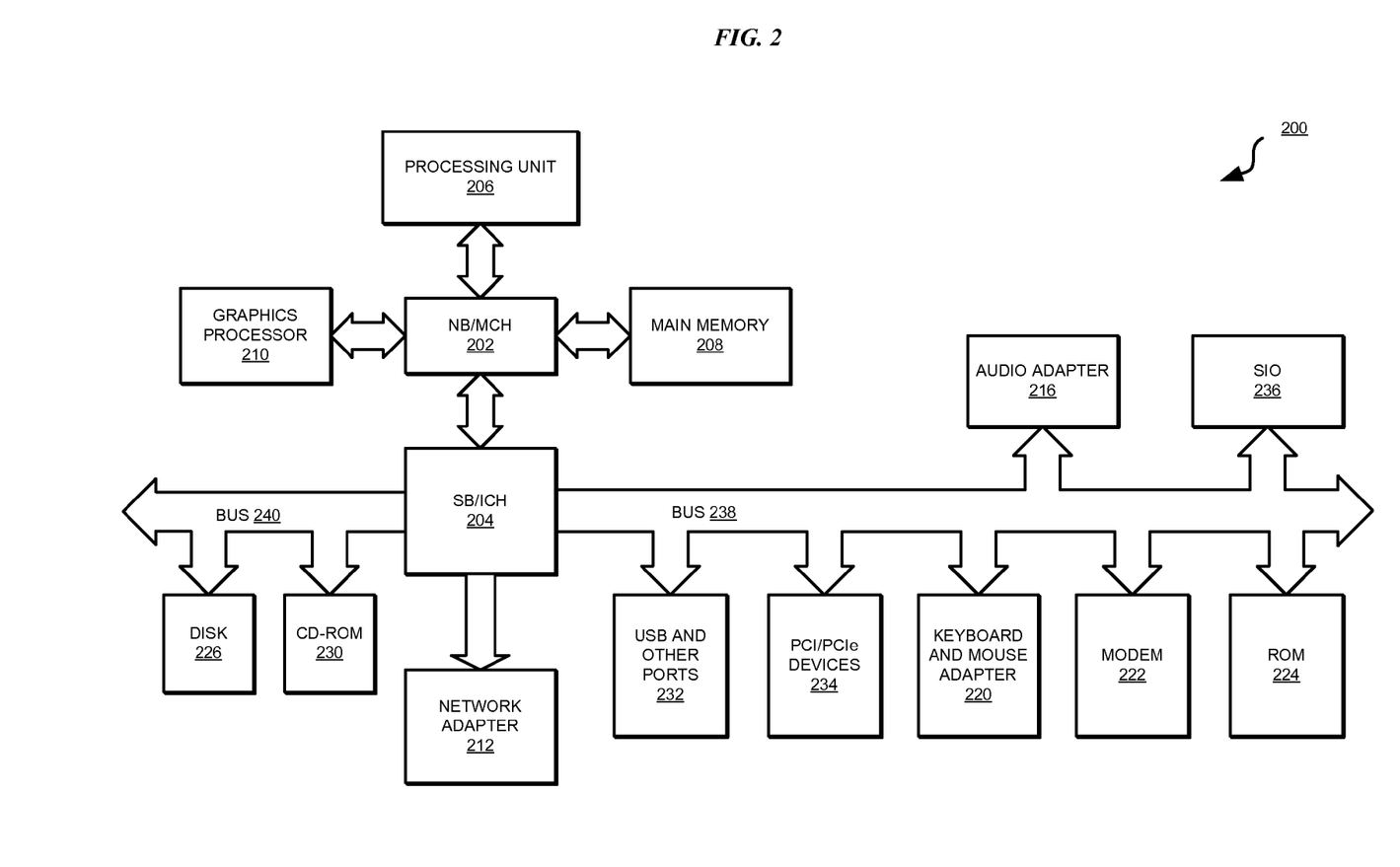
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a pictorial representation of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables. Server 104 and server 106 couple to network 102 along with storage unit 108. Software applications may execute on any computer in data processing environment 100.

In addition, clients 110, 112, and 114 couple to network 102. A data processing system, such as server 104 or 106, or client 110, 112, or 114 may contain data and may have software applications or software tools executing thereon.

Any data processing system, such as server 104, may include design cool 105 that may be improved using an embodiment. Design tool 105 may be any suitable software application for designing ICs. Application 107 may be any combination of hardware and software usable for implementing an embodiment of the invention such that the embodiment is usable with design tool 105 for improved routing of local clock interconnects.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as server 104 or client 110 in FIG. 1, in which computer usable program code or instructions implementing the processes of the illustrative embodiments may be located for the illustrative embodiments.

In the depicted example, data processing system 200 employs a hub architecture including North Bridge and memory controller hub (NB/MCH) 202 and south bridge and input/output (I/O) controller hub (SB/ICH) 204. Processing unit 206, main memory 208, and graphics processor 210 are coupled to north bridge and memory controller hub (NB/MCH) 202. Processing unit 206 may contain one or more processors and may be implemented using one or more heterogeneous processor systems. Graphics processor 210 may be coupled to the NB/MCH through an accelerated graphics port (AGP) in certain implementations.

In the depicted example, local area network (LAN) adapter 212 is coupled to south bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to south bridge and I/O controller hub 204 through bus 238. Hard disk drive (HDD) 226 and CD-ROM 230 are coupled to south bridge and I/O controller hub 204 through bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE) or serial advanced technology attachment (SATA) interface. A super I/O (SIO) device 236 may be coupled to south bridge and I/O controller hub (SB/ICH) 204.

An operating system runs on processing unit 206. The operating system coordinates and provides control of various components within data processing system 200 in FIG. 2. The operating system may be a commercially available operating system such as Microsoft® Windows® (Microsoft and Windows are trademarks of Microsoft Corporation in the United States, other countries, or both), or Linux® (Linux is a trademark of Linus Torvalds in the United States, other countries, or both). An object oriented programming system, such as the Java™ programming system, may run in conjunction with the operating system and provides calls to the operating system from Java™ programs or applications executing on data processing system 200 (Java and all Java-based trademarks and logos are trademarks or registered trademarks of Oracle and/or its affiliates).

Program instructions for the operating system, the object-oriented programming system, the processes of the illustrative embodiments, and applications or programs are located on storage devices, such as hard disk drive 226, and may be loaded into a memory, such as, for example, main memory 208, read only memory 224, or one or more peripheral devices, for execution by processing unit 206. Program instructions may also be stored permanently in non-volatile memory and either loaded from there or executed in place. For example, the synthesized program according to an embodiment can be stored in non-volatile memory and loaded from there into DRAM.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in north bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a PDA.

Figures 3, 4:
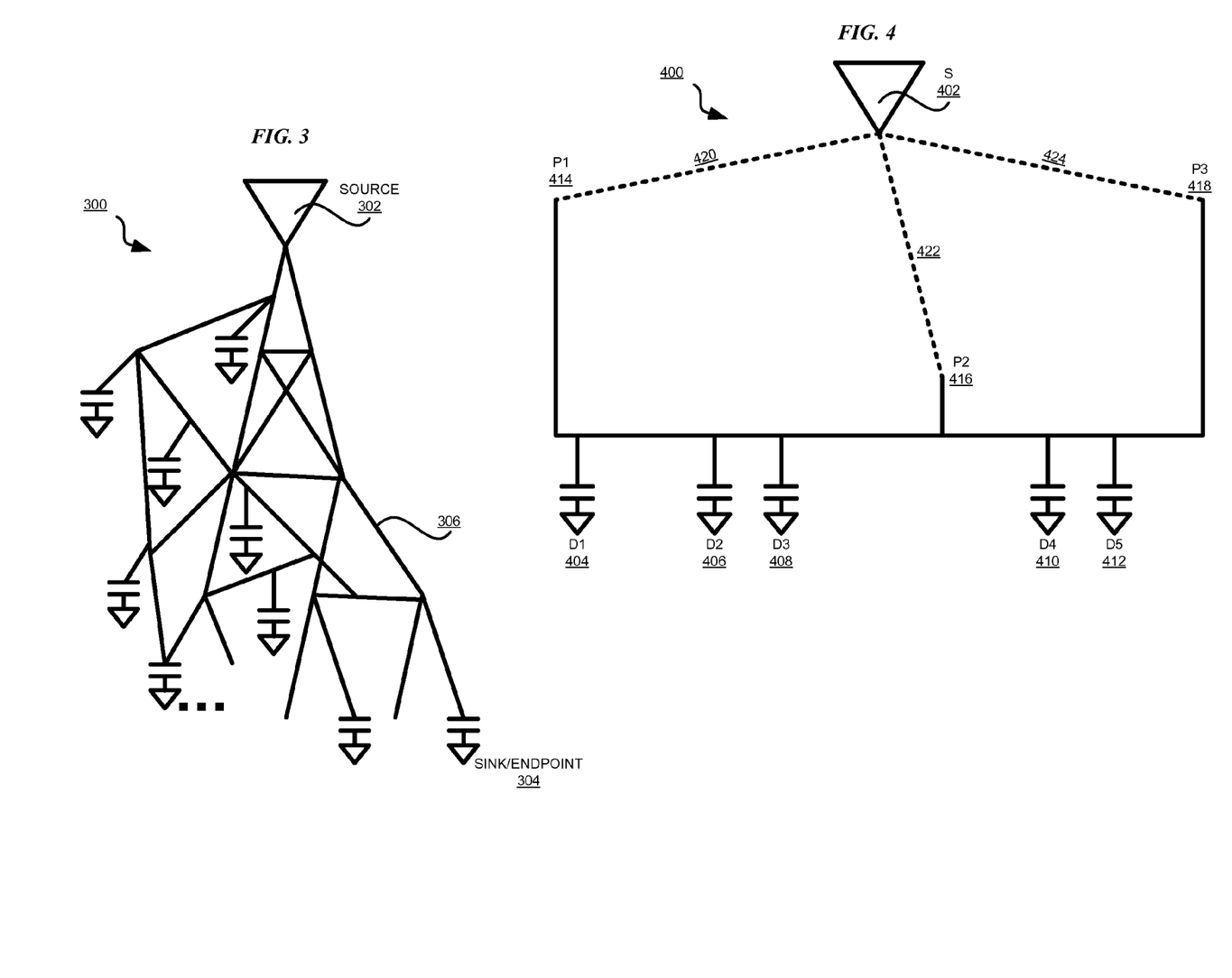
FIG. 3 depicts a block diagram of an example non-tree network structure that can be improved using an illustrative embodiment.
FIG. 4 depicts a block diagram of estimating local non-tree delay without upstream information in a non-tree network that can be used for improved routing of local clock interconnects in accordance with an illustrative embodiment.

With reference to FIG. 3, this figure depicts a block diagram of an example non-tree network structure that can be improved using an illustrative embodiment. Design tool 105 in FIG. 1 produces network 300.

Source 302 provides clock signal to several endpoints, including endpoint 304. Endpoint 304 is depicted as a capacitance connected to the ground only as an example and not to imply a limitation on the illustrative embodiments. Endpoint 304 can represent any component, such as a latch, a flip-flop, a register, a memory unit, or any logic gate. As depicted, endpoint 304 can receive the clock signal from source 302 from any one of numerous paths in network 300. Segment 306 participates in some of those several paths. As described above, computing Elmore delay in segment 306 requires all the information about the resistance and capacitance of entire network 300.

The illustrative embodiments recognize that building a non-tree from bottom-up can remove some of the complexity in computing the delay in segment 306. FIG. 4 illustrates the idea of bottom-up construction in further detail.

With reference to FIG. 4, this figure depicts a block diagram of estimating local non-tree delay without upstream information in a non-tree network that can be used for improved routing of local clock interconnects in accordance with an illustrative embodiment. Non-tree network 400 can be a part of network 300 in FIG. 3. Source 402 corresponds to source 302.

Suppose that source 402 labeled "S" is a virtual source, such as a distribution point in a given IC design. Suppose that source S drives endpoints 404 labeled "D1", 406 labeled "D2", 408 labeled "D3", 410 labeled "D4", and 412 labeled "D5". Further suppose that source 402 drives these endpoints from distribution points 414 labeled "P1", 416 labeled "P2", and 418 labeled "P3". Dotted lines 420, 422, and 424, connecting distribution points P1, P2, and P3 to source S, respectively, represent the upstream non-tree network between P1 and S, P2 and S, and P3 and S, respectively.

If each of upstream sub-networks 420, 422, and 424 were assumed to be connected using ideal conductors, clock skew at distribution points P1, P2, and P3 would be zero. By making such an assumption, P1, P2, and P3 are connected to each other without any delay, and an embodiment is free to compute the downstream delay from those distribution points relatively easily and efficiently as compared to a full non-tree delay computation.

The downstream delay computation performed in this manner does not require the upstream delay information, because the upstream delay information has been removed as zero. Thus, even in a non-tree network, when the upstream portion of the non-tree network is unknown or not-yet-constructed, an embodiment can compute, with sufficient accuracy, the delay caused by specific segments that are placed in downstream sub-network by another embodiment.

Figure 5:
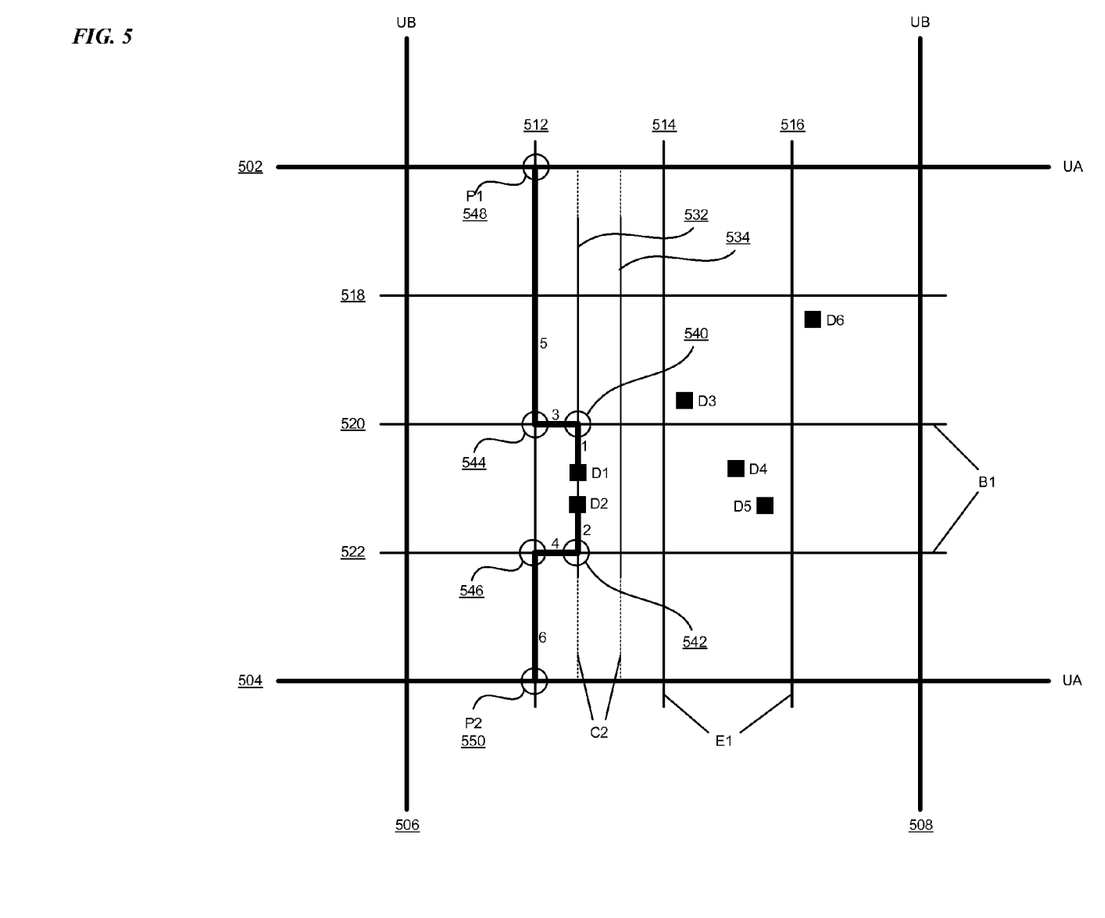
FIG. 5 depicts a local clock interconnect routing methodology that is improved by an illustrative embodiment.

With reference to FIG. 5, this figure depicts a local clock interconnect routing methodology that is improved by an illustrative embodiment. Design segment 500 depicts several layers in the design. A source (not shown), such as source 402 in FIG. 4, powers grid interconnects 502, 504, 506, and 508.

Two example grids, are depicted in FIG. 5, namely, a first grid formed by interconnects 502 and 504 labeled "UA" and interconnects 506 and 508 labeled "UB", and a second grid formed by interconnects 512, 514, and 516 labeled "E1" and interconnects 518, 520, and 522 labeled "B1". Interconnects 532 and 534 are example interconnects labeled "C2", which could also participate in a third grid (not shown). E1 interconnects represent interconnects at level E1, B1 interconnects represent interconnects at level B1, and C2 interconnects represent interconnects at level C2. In the depicted design, the C2 layer is the lowest layer among C2, B1, E1, UA and UB, the B1 layer being higher than the C2 layer, and the E1 layer being higher than the B1 layer. The UA and UB layers are higher than the E1 layer in some order.

Except UA and UB, each of the grids is a virtual grid, that is, a grid formed by reserving routes for clock signal wires without actual wires occupying those routes. Endpoints, or destinations, D1, D2, D3, D4, D5, and D6 occupy the C2 layer. Only for the purposes of illustration and the clarity of the description, clock signals are to be routed to the endpoints such that a tree or a non-tree network spanning several of the depicted layers connects interconnects UA to each of the endpoints.

Using endpoints D1 and D2 as examples, a first step of bottom-up network construction connects D1 to an interconnect in the next higher layer, layer B1. Wire 1 connects D1 to interconnect 520, creating virtual pin 540. Likewise, wire 2 connects D2 to interconnect 522, creating virtual pin 542.

Next, continuing with the bottom-up methodology, virtual pins 540 and 542 are connected to interconnects in the next higher layer, layer E1. Wire 3 connects virtual pin 542 to interconnect 512, creating virtual pin 544. Likewise, wire 4 connects virtual pin 542 to interconnect 512, creating virtual pin 546.

Next, continuing with the bottom-up methodology, virtual pins 544 and 546 are connected to interconnects in the next higher layer, layer UA or UB. Regarding the UA layer as the next layer, only as an example, wire 5 connects virtual pin 544 to interconnect 502, creating virtual pin 548, labeled "P1". Likewise, wire 6 connects virtual pin 546 to interconnect 504, creating virtual pin 550, labeled "P2".

Other endpoints D3, D4, D5, and D6 could also be connected (not shown) in this manner to interconnects 502 and 504 (or interconnects 506 and 508 in layer UB, or a combination of interconnects 502, 504, 506, and 508 in layers UA and UB). Thus, local clock interconnect for endpoint D1 is a sub-network of a non-tree network structure, which originates from P1 and includes the path having segments 1, 3, and 5 via virtual pins 540, 544, and 548 (referred to herein as P1 sub-network). Likewise, local clock interconnect for endpoint D2 is another sub-network of the non-tree network structure, which originates from P2 and includes the path having segments 2, 4, and 6 via virtual pins 542, 546, and 550 (referred to herein as P2 sub-network).

Notice the similarities between the P1 sub-network of FIG. 5, and the non-tree sub-networks formed between distribution point P1 414 and endpoint D1 404 in FIG. 4. Likewise, similarities exist between the P1 sub-network of FIG. 5, and the non-tree sub-networks formed between distribution point P1 414 and endpoint D1 404 in FIG. 4. The downstream delay in P1 sub-network and P2 sub-network can therefore be computed without the knowledge of the remainder non-tree network, using an embodiment described with reference to FIG. 4. An embodiment can be used to calculate the delay from virtual pins 548 and 550 to endpoints D1 or D2 even when virtual pins 544 and 546 are connected along the reserved track 512 using actual metal interconnects.

Figure 6:
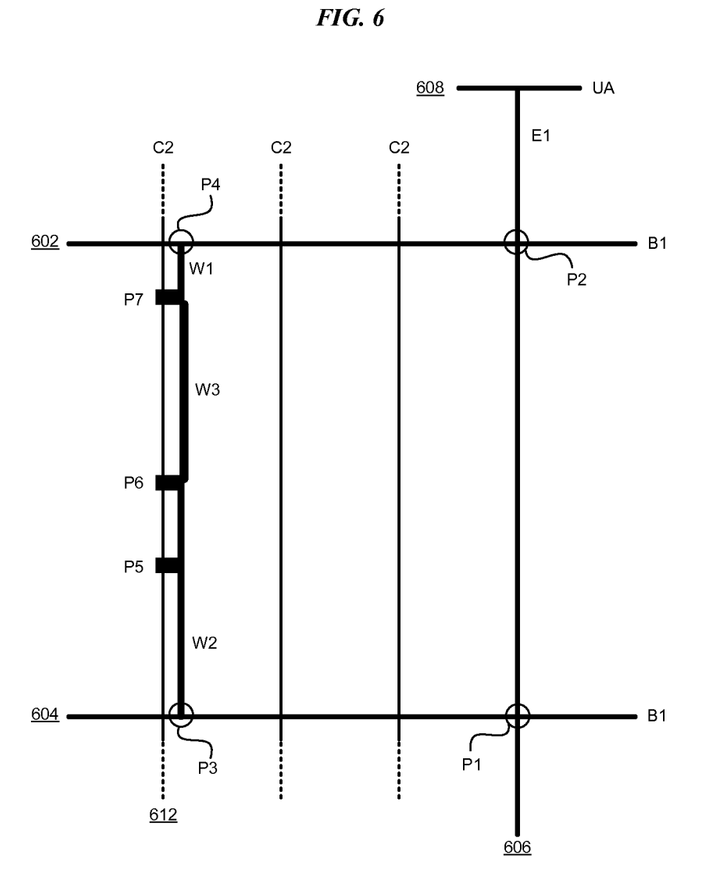
FIG. 6 depicts a block diagram of an example process of improving routing of local clock interconnects in accordance with an illustrative embodiment.

With reference to FIG. 6, this figure depicts a block diagram of an example process of improving routing of local clock interconnects in accordance with an illustrative embodiment. Interconnects 602 and 604, labeled "B1" are each similar to interconnects 518, 520, or 522 similarly labeled in FIG. 5. Interconnect 606 labeled "E1" is similar to interconnect 512, 514, or 516, similarly labeled in FIG. 5. Interconnect 608 labeled "UA" is similar to interconnect 502 or 504 similarly labeled in FIG. 5. Interconnect 612 labeled "C2" is similar to interconnect 532 or 534 similarly labeled in FIG. 5.

P1, P2, P3, and P4 are distribution points, and P5, P6, and P7 are endpoints. P1-P7 are collectively referred to as "points" in FIG. 6. The sub-networks to endpoints P7, P8, and P9 are distinct from, and do not correspond to, the P1 and P2 sub-networks in FIG. 5.

In the bottom-up methodology of an embodiment, for each layer, such as layer C2, a point in the layer is routed to the next higher layer. For example, interconnect W1 connects P7 to P4, and interconnect W2 connects P6 and P5 both to P3.

The embodiment computes a delay in the route formed in this manner, to with, delays in segment P4-P7 and segment P3-P5-P6. If the delay in either routes exceeds a predetermined delay threshold T, an embodiment identifies in the set of endpoints, such endpoints P5, P6, and P7, those endpoints that are closer than a threshold distance from each other and not connected to each other and connects them using a cross-link. For example, P7 and P6 are endpoints not connected to each other and within the threshold distance from one another. The embodiment connects P6 and P7 using interconnect W3, which forms the cross-link.

P4, P5, P6, P7, W1, W2, and W3 are depicted separately from interconnect 612 only for the clarity of the illustration. Actually, P4, P5, P6, P7, W1, W2, and W3 would overlay interconnect 612 in an IC design, as depicted by the circles around points P3 and P4.

Now the embodiment recomputes the delay of route P4-P7-P6-P5-P3. The delay should reduce because of the newly-formed non-tree sub-network. When the delay is within the threshold T, the embodiment keeps the cross-link interconnect W3. When the delay is not within the threshold T, the embodiment removes the cross-link interconnect W3 and may try another cross-link using another pair of disconnected endpoints (not shown).

Operating in this manner, an embodiment alleviates a problem in Elmore delay computation—to continue Elmore delay computation algorithm, the algorithm needs to calculate the delay in segment P4-P2 and segment P3-P1, for which the algorithm needs downstream capacitance values at points P4 and P3 respectively. For example, an embodiment, operating in conjunction with the delay algorithm, computes the capacitance values as follows—

The embodiment assumes that P4 is connected to P3, such as by using the cross-link interconnect W3 described above. The embodiment uses any suitable delay calculator to calculate the maximum delay point in the path between P3 and P4, because capacitance is a factor in the delay.

Next, one embodiment assumes a virtual cut in the path between P3 and P4 at the maximum delay point Pi (not shown), or where the capacitance is correspondingly at a maximum. Pi could be an arbitrary point in the route and not at any given actual or virtual point. Another embodiment can virtually cut the route so that the cut occurs at an endpoint, such as by cutting the route at which ever actual or virtual point offers the comparatively highest delay, i.e., using the depicted example, to minimize MAX[delay if cut at P5, delay if cut at P6, delay if cut at P7].

An embodiment distributes the capacitance in route P4-P7-P6-P5-P3 by assigning one half of the delay at the cut point to P3 and the other half of the delay at the cut point to P4. By so doing, an embodiment calculates the capacitance at points P3 and P4 that the Elmore delay computation algorithm needs to proceed. Observe that the embodiments are able to compute the capacitance values without the knowledge of upstream non-tree network, or the delays therein.

Now that an embodiment has computed to a sufficient degree of accuracy the delays in the bottom part of a non-tree sub-network, the embodiment can repeat the same process at other non-tree sub-networks in the same layers as in the depicted example, or in other layers of the design. The routing of the local clock interconnect resulting from an embodiment operating in this manner also allows for minimizing the delays at the endpoints, distribution points, or a combination thereof.

Figure 7:
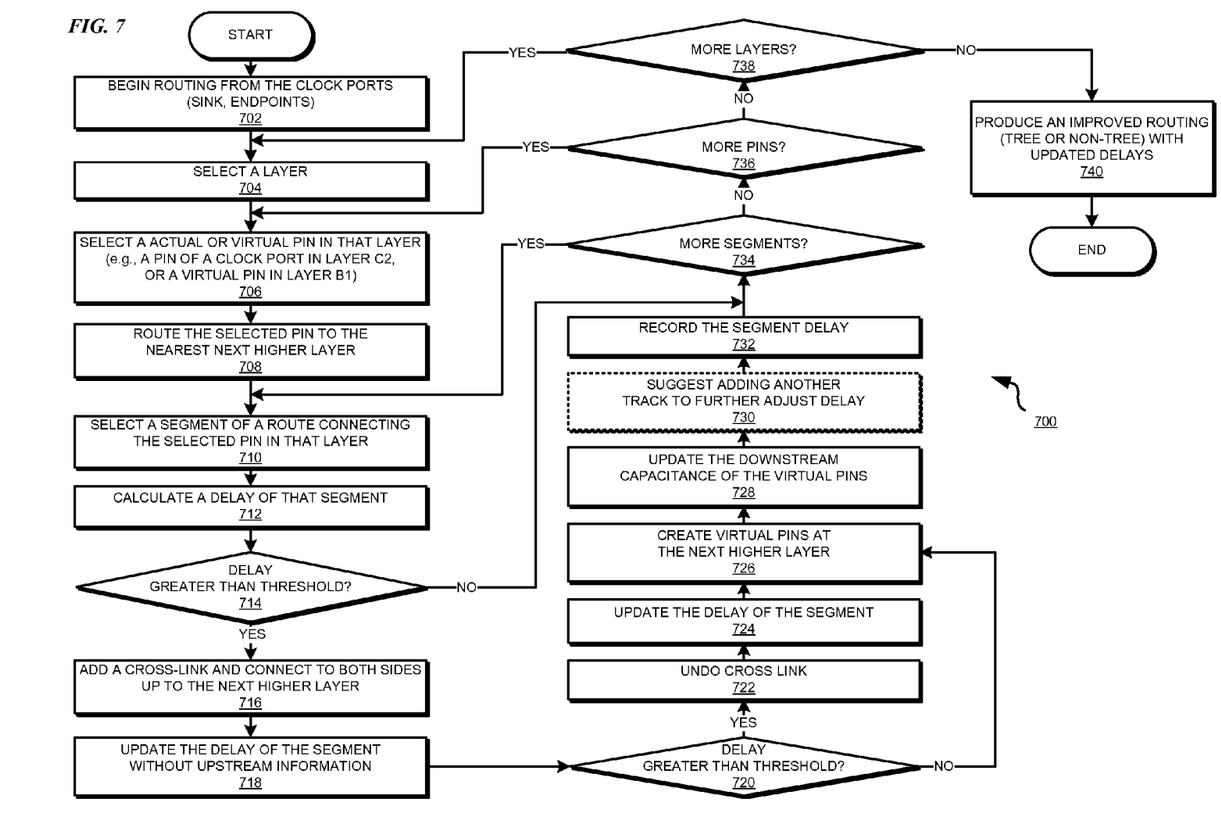
FIG. 7 depicts a flowchart of an example process of improving routing of local clock interconnects in accordance with an illustrative embodiment.

With reference to FIG. 7, this figure depicts a flowchart of an example process of improving routing of local clock interconnects in accordance with an illustrative embodiment. Process 700 can be implemented in application 107 in FIG. 1.

Process 700 begins routing from the clock ports, to with, the endpoints (step 702). Process 700 selects a layer, such as layer C2 or B1 in FIG. 6 (step 704). Process 700 selects an actual or a virtual pin in the selected layer, such as point P7 in FIG. 6 if layer C2 were selected in step 704, or point P4 in FIG. 6 if layer B1 were selected in step 704, (step 706).

Process 700 routes the selected pin to the nearest next higher layer (step 708). Process 700 selects a segment of a route connecting the selected pin in that layer (step 710). Process 700 calculates a delay of that segment (step 712).

Process 700 determines whether the delay of the segment is greater than a predetermined delay threshold, such as threshold T in the description of FIG. 6 (step 714). If the delay is greater than the threshold ("Yes" path of step 714), process 700 adds a cross-link and connects both sides of the segment to the next higher layer (step 716). Process 700 then updates the delay of the segment with the new delay with the cross-link in place (step 718). If the delay is not greater than the threshold ("No" path of step 714), process 700 proceeds to step 734.

Process 700 determines whether the updated delay is still greater than the threshold (step 720). If the delay remains greater than the threshold ("Yes" path of step 720), process 700 removes the cross-link by undoing the cross-link (step 722). Process 700 updates the delay of the segment by resetting the delay to the delay computed in step 712 (step 724). If the delay is no longer greater than the threshold ("No" path of step 714), process 700 proceeds to step 726.

Process 700 creates one or more virtual pins at the next higher layer from the layer selected in step 704 (step 726). Process 700 updates the downstream capacitance of the virtual pins, such as by the cut process described with respect to FIG. 6 (step 728). Optionally, process 700 may suggest adding more or different virtual tracks in the selected layer, such as more or different C2 tracks in FIG. 6, for further improving the delay (step 730). Process 700 records the segment delay using the capacitance known at the virtual pins (step 732).

Process 70 determines whether more segments have to be processed in this manner (step 734). If more segments have to be processed in the selected layer ("Yes" path of step 734), process 700 returns to step 710 and selects another segment. If no more-segments have to be processed in the selected layer ("No" path of step 734), process 700 determines whether more pins in the selected layer have to be processed in this manner (step 736). If more pins have to be processed in the selected layer ("Yes" path of step 736), process 700 returns to step 706 and selects a different actual or virtual pin. If no more pins have to be processed in the selected layer ("No" path of step 736), process 700 determines whether more layers have to processed in this manner (step 738). If more layers have to be processed ("Yes" path of step 738), process 700 returns to step 704 and selects a different layer. If no more layers have to be processed ("No" path of step 738), process 700 produces an improved routing of local clock interconnects, including tree network structures, non-tree network structures or a combination thereof. Process 700 ends thereafter.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, a computer implemented method, system, and computer program product are provided in the illustrative embodiments for improved routing of local clock interconnects. Using an embodiment, a delay computation algorithm can use a bottom-up delay estimation technique described herein to compute downstream delays in a non-tree network without knowing or computing upstream characteristics of the network. An embodiment detects and remedies delay violations as the algorithm progresses from bottom up.

An embodiment suggests, or automatically adds cross-link interconnects to correct delay violations when such cross-links can reduce the delay below a specified threshold. An embodiment suggests, or automatically adds additional tracks or wires to correct delay violations.

Furthermore, an embodiment can take a specified delay threshold and distribute the delay threshold across various layers. For example, if a total delay of 1.6 pico-seconds is specified for a route in layers E1-B1-C2, an embodiment can allocate 0.6 pico-second of that total threshold to interconnects in layer E1, 0.5 pico-second to interconnects in layer B1, and 0.5 pico-second to interconnects in layer C2. An embodiment can select only those cross-link based local clock interconnect solutions that do not violate the allocated thresholds.

The illustrative embodiments are described from the point of view of reducing a clock skew at a pin only as an example to maintain clarity of the description and not as a limitation on the illustrative embodiments. An embodiment can be used as described, or adapted using this description to reduce a power dissipation of clock distribution network, reduce a maximum clock skew in the IC design, reduce a size of clock network in the IC design, reduce a clock jitter in the IC design, reduce a maximum clock latency in the IC design, and many other similar purposes or advantages within the scope of the illustrative embodiments.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) or computer readable media having computer readable program code embodied thereon.

Any combination of one or more computer readable storage device(s) or computer readable media may be utilized. The computer readable medium may be a computer readable signal medium or a computer readable storage medium. A computer readable storage device may be an electronic, magnetic, optical, electromagnetic, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible device that can store a program for use by or in connection with an instruction execution system, apparatus, or device. The term "computer usable storage device" does not encompass a signal propagation medium such as a copper cable, optical fiber, or wireless transmission medium, any description in this disclosure to the contrary notwithstanding.

Program code embodied on a computer readable storage device or computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to one or more processors of one or more general purpose computers, special purpose computers, or other programmable data processing apparatuses to produce a machine, such that the instructions, which execute via the one or more processors of the computers or other programmable data processing apparatuses, create means for implementing the functions/acts specified in the flowchart and/or block diagram block or blocks.

These computer program instructions may also be stored in one or more computer readable storage devices or computer readable media that can direct one or more computers, one or more other programmable data processing apparatuses, or one or more other devices to function in a particular manner, such that the instructions stored in the one or more computer readable storage devices or computer readable medium produce an article of manufacture including instructions which implement the function/act specified in the flowchart and/or block diagram block or blocks.

The computer program instructions may also be loaded onto one or more computers, one or more other programmable data processing apparatuses, or one or more other devices to cause a series of operational steps to be performed on the one or more computers, one or more other programmable data processing apparatuses, or one or more other devices to produce a computer implemented process such that the instructions which execute on the one or more computers, one or more other programmable data processing apparatuses, or one or more other devices provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A computer implemented method for improved routing of local clock interconnects in an integrated circuit (IC) design, the computer implemented method comprising:
    selecting, from a set of endpoints in the IC design, an endpoint, wherein the endpoint is an electronic component represented in the IC design, and includes a representation of a pin at which an electrical connection in the IC design can be configured;
    calculating an original delay in a segment in a route that supplies a clock signal to the pin from a distribution point;
    adding, responsive to the original delay exceeding a delay threshold, a cross-link in the route such that the cross-link completes a non-tree sub-network including the segment, wherein the non-tree sub-network is a part of a non-tree network of interconnects carrying the clock signal in the IC design;
    calculating, using a processor and a memory, a revised delay in the segment without using delay information corresponding to another non-tree sub-network in the non-tree network, wherein the calculating the revised delay includes
        virtually manipulating the non-tree sub-network to compute a downstream delay value from the distribution point,
        wherein the downstream delay value is computed without using an upstream delay value from the distribution point, and
        wherein the downstream delay value enables computing the upstream delay value from the distribution point; and
    modifying the route using the revised delay in the segment such that a clock skew at the pin is reduced.

2. The computer implemented method of claim 1, wherein the virtually manipulating further comprises:
    determining a point in the route at which the delay in the route is at a maximum value;
    creating a first virtual pin and a second virtual pin near the point; and
    distributing a total load capacitance corresponding to the maximum value to the first virtual pin at a first end of the route and the second virtual pin at a second end of the route, such that a first portion of downstream capacitance in the non-tree sub-network is assigned to the first virtual pin and a second portion of downstream capacitance in the non-tree sub-network is assigned to the second virtual pin.

3. The computer implemented method of claim 2, wherein the first and the second portions are each one half of the maximum value.

4. The computer implemented method of claim 1, wherein the threshold is a portion of a total threshold, the portion being allocated to the first layer.

5. The computer implemented method of claim 1, further comprising:
removing, responsive to the revised delay exceeding the threshold, the cross-link.

6. The computer implemented method of claim 1, further comprising:
adding a second cross-link in a different route such that the second cross-link completes a another non-tree sub-network including the segment.

7. The computer implemented method of claim 1, further comprising:
selecting a first layer corresponding to the endpoint in which the pin of the endpoint is located; and
routing, forming the route, the pin to a second layer, wherein the second layer is the next higher layer to the first layer in the IC design, and wherein the segment is iteratively selected from the route.

8. The computer implemented method of claim 1, wherein the another non-tree sub-network is upstream from the non-tree sub-network in the non-tree network.

9. A computer usable program product comprising a computer usable storage device including computer usable code for improved routing of local clock interconnects in an integrated circuit (IC) design, the computer usable code comprising:
computer usable code for selecting, from a set of endpoints in the IC design, an endpoint, wherein the endpoint is an electronic component represented in the IC design, and includes a representation of a pin at which an electrical connection in the IC design can be configured;
computer usable code for calculating an original delay in a segment in a route that supplies a clock signal to the pin;
computer usable code for adding, responsive to the original delay exceeding a delay threshold, a cross-link in the route such that the cross-link completes a non-tree sub-network including the segment, wherein the non-tree sub-network is a part of a non-tree network of interconnects carrying the clock signal in the IC design;
computer usable code for calculating, using a processor and a memory, a revised delay in the segment without using delay information corresponding to another non-tree sub-network in the non-tree network, wherein the calculating the revised delay includes
virtually manipulating the non-tree sub-network to compute a downstream delay value from the distribution point,
wherein the downstream delay value is computed without using an upstream delay value from the distribution point, and
wherein the downstream delay value enables computing the upstream delay value from the distribution point; and
computer usable code for modifying the route using the revised delay in the segment such that at least one of (i) a clock skew at the pin is reduced, (ii) a power dissipation of clock distribution is reduced, (iii) a maximum clock skew in the IC design is reduced, (iv) a size of clock network is reduced, (v) a clock jitter in the IC design is reduced, and (vi) a maximum clock latency in the IC design is reduced.

10. The computer usable program product of claim 9, wherein the virtually manipulating further comprises:
computer usable code for determining a point in the route at which the delay in the route is at a maximum value;
computer usable code for creating a first virtual pin and a second virtual pin near the point; and
computer usable code for distributing a total load capacitance corresponding to the maximum value to the first virtual pin at a first end of the route and the second virtual pin at a second end of the route, such that a first portion of downstream capacitance in the non-tree sub-network is assigned to the first virtual pin and a second portion of downstream capacitance in the non-tree sub-network is assigned to the second virtual pin.

11. The computer usable program product of claim 10, wherein the first and the second portions are each one half of the maximum value.

12. The computer usable program product of claim 9, wherein the threshold is a portion of a total threshold, the portion being allocated to the first layer.

13. The computer usable program product of claim 9, further comprising:
computer usable code for removing, responsive to the revised delay exceeding the threshold, the cross-link.

14. The computer usable program product of claim 9, further comprising:
computer usable code for adding a second cross-link in a different route such that the second cross-link completes a another non-tree sub-network including the segment.

15. The computer usable program product of claim 9, further comprising:
computer usable code for selecting a first layer corresponding to the endpoint in which the pin of the endpoint is located; and
computer usable code for routing, forming the route, the pin to a second layer, wherein the second layer is the next higher layer to the first layer in the IC design, and wherein the segment is iteratively selected from the route.

16. The computer usable program product of claim 9, wherein the another non-tree sub-network is upstream from the non-tree sub-network in the non-tree network.

17. The computer usable program product of claim 9, wherein the computer usable code is stored in a computer readable storage medium in a data processing system, and wherein the computer usable code is transferred over a network from a remote data processing system.

18. The computer usable program product of claim 9, wherein the computer usable code is stored in a computer readable storage medium in a server data processing system, and wherein the computer usable code is downloaded over a network to a remote data processing system for use in a computer readable storage medium associated with the remote data processing system.

19. A data processing system for improved routing of local clock interconnects in an integrated circuit (IC) design, the data processing system comprising:
a storage device, wherein the storage device stores computer usable program code; and
a processor, wherein the processor executes the computer usable program code, and wherein the computer usable program code comprises:
computer usable code for selecting, from a set of endpoints in the IC design, an endpoint, wherein the endpoint is an electronic component represented in the IC design, and includes a representation of a pin at which an electrical connection in the IC design can be configured;

computer usable code for calculating an original delay in a segment in a route that supplies a clock signal to the pin;

computer usable code for adding, responsive to the original delay exceeding a delay threshold, a cross-link in the route such that the cross-link completes a non-tree sub-network including the segment, wherein the non-tree sub-network is a part of a non-tree network of interconnects carrying the clock signal in the IC design;

computer usable code for calculating, using a processor and a memory, a revised delay in the segment without using delay information corresponding to another non-tree sub-network in the non-tree network, wherein the calculating the revised delay includes virtually manipulating the non-tree sub-network to compute a downstream delay value from the distribution point, wherein the downstream delay value is computed without using an upstream delay value from the distribution point, and wherein the downstream delay value enables computing the upstream delay value from the distribution point; and computer usable code for modifying the route using the revised delay in the segment such that at least one of (i) a clock skew at the pin is reduced, (ii) a power dissipation of clock distribution is reduced, (iii) a maximum clock skew in the IC design is reduced, (iv) a size of clock network is reduced, (v) a clock jitter in the IC design is reduced, and (vi) a maximum clock latency in the IC design is reduced.

20. The data processing system of claim 19, wherein the virtually manipulating further comprises:

computer usable code for determining a point in the route at which the delay in the route is at a maximum value;

computer usable code for creating a first virtual pin and a second virtual pin near the point; and computer usable code for distributing a total load capacitance corresponding to the maximum value to the first virtual pin at a first end of the route and the second virtual pin at a second end of the route, such that a first portion of downstream capacitance in the non-tree sub-network is assigned to the first virtual pin and a second portion of downstream capacitance in the non-tree sub-network is assigned to the second virtual pin.

* * * * *